United States Patent [19]

Tomioka et al.

[11] Patent Number: 5,316,742
[45] Date of Patent: May 31, 1994

[54] SINGLE CRYSTAL PULLING APPARATUS

[75] Inventors: Junsuke Tomioka, Hiratsuka; Kazunori Nagai, Miyasaki; Akihiro Matsuzaki, Hiratsuka, all of Japan

[73] Assignee: Komatsu Electronic Metals Co., Ltd., Hiratsuka, Japan

[21] Appl. No.: 772,928

[22] Filed: Oct. 8, 1991

[51] Int. Cl.$^5$ .................................... C30B 15/14
[52] U.S. Cl. ............................ 117/217; 417/932
[58] Field of Search ............ 156/600, 601, 617.1, 156/618.1, 619.1, 620.4; 422/245, 249

[56] References Cited

U.S. PATENT DOCUMENTS

| | | | |
|---|---|---|---|
| 3,857,679 | 12/1974 | Allred | 422/249 |
| 4,686,091 | 8/1987 | Washizuka et al. | 422/249 |
| 4,956,153 | 9/1990 | Yamagishi et al. | 156/617.1 |
| 4,957,713 | 9/1990 | Kravetsky et al. | 156/617.1 |
| 4,981,549 | 1/1991 | Yamashita et al. | 156/617.1 |

FOREIGN PATENT DOCUMENTS 62-138386 6/1987 Japan.
63-256593 10/1988 Japan.

Primary Examiner—Robert Kunemund
Assistant Examiner—Felisa Garrett
Attorney, Agent, or Firm—Welsh & Katz, Ltd.

[57] ABSTRACT

A single crystal pulling apparatus using Czochralski method includes a first screen in the shape of a hollow round cylinder. One side of the first screen facing a quartz crucible is made of a heat absorbent material and another side of the first screen is made of a heat insulator material. The upper and lower ends of the first screen have an outwardly extending flange and an inwardly extending flange, respectively. The first screen surrounds a single crystal pulling zone such that its lower flange is positioned near a melt charged zone in the crucible. The apparatus also includes a second screen positioned inside the first screen. The vertical section of the second screen has the shape of a substantially parabola and the center of the bottom of the second screen is open and surrounds the single crystal pulling zone. The upper end of the second screen has an outwardly extending flange. The apparatus increases the pulling speed of a grown single crystal and improves preventing degree of dislocation in the grown single crystal due to contamination of the grown single crystal with impurities.

21 Claims, 16 Drawing Sheets

SINGLE CRYSTAL PULLING APPARATUS

BACKGROUND OF THE INVENTION

1. Field of the Invention

The present invention relates to a single crystal pulling apparatus using Czochralski method and more particularly to a single crystal pulling apparatus having a screen for preventing a contamination of a crystal with impurities and enabling a single crystal rod to be pulled at high speed without blocking monocrystallization processes.

2. Description of the Related Art

Unexamined Japanese patent application publication No. 62-138386 discloses a single crystal pulling apparatus with an improved pulling speed in which a radiation screen is provided near the surface of a melt, the screen being of multi-layered insulating structure and having the shape of a substantially inverted cone, the surface of the screen being made of a sintered ceramic material or ceramic coated. The screen serves to block heat radiated from the melt to prevent a single crystal under pulling from being heated, thereby to increase the pulling speed while preventing contamination of the single crystal.

In addition, unexamined Japanese patent application publication No. 63-2566593 discloses a single crystal pulling apparatus comprises a screen with a section in the shape of an inverted trapezoid, which surrounds a single crystal pulling zone. The apparatus is provide with a cooling device to improve the operation of the screen.

These conventional apparatuses involve the following problems:

1) To increase pulling speed of a grown crystal, it is important to quickly dissipate, from the grown crystal, heat conducted from the melt, latent solidification heat generated in crystallization process, and heat radiated from heat sources such as the melt and a heater. In particular, when a temperature gradient at and around a solid-liquid interface is large, the pulling speed can be increased even if the cooling speed (i.e., the temperature of the grown crystal) is slightly low.

However, the screen in the shape of, for example, an inverted cone does not have sufficiently small solid angle for a grown crystal, especially at the solid-liquid interface. Therefore, the screen cannot dissipate all of heat radiated from the solid-liquid interface and from its vicinity. Thus, this conventional apparatus is difficult to achieve a further pulling speed increase.

2) When the radiation screen whose inner surface is made of a material having a high thermal emissivity and a high thermal conductivity such as carbon or silicon carbide (SiC) is used with a cooling device, the inner surface of the radiation screen absorbs heat radiated from the grown crystal so as to heat the radiation screen to a high temperature. As a result, the grown crystal receives heat radiated from both the screen and the grown crystal itself reflected by the screen and holds the heat therein. Thus, it is difficult to achieve a further increase in the pulling speed.

3) When the radiation screen whose inner surface is made of a material having a high reflectivity is used with a cooling device, the screen reflects heat radiated from the grown crystal and the reflected heat is held in the grown crystal, which suppresses a further increase in the pulling speed.

4) Since the radiation screen has a sectional shape of the inverted trapezoid or inverted cone and is placed remote from the surface of the melt and the wall of a crucible both radiating a large amount of heat and the radiated heat is insulated near the grown crystal, it cannot achieve a sufficiently cooling to the grown crystal. Thus, a further increase in the pulling speed is suppressed.

Unexamined Japanese patent application publication No. 63-50391 discloses a single crystal pulling apparatus capable of increasing the pulling speed of a single crystal and improving the degree of prevention of dislocation due to contamination of a crystal with impurities. The apparatus has a hollow cylinder which surrounds the grown single crystal, whose inner surface provides a radiated heat reflection prevention surface, and whose surface facing a raw melt provides a radiated heat reflection surface. A cooling device is provided around the cylinder.

This conventional apparatus, however, involves the following problems:

1) The radiated heat reflection surface provided in a lower portion of the cooled cylinder is made of a material having a metal groove or layer. If a heavy metal is used for the material, the heavy metal is likely to contaminate a single crystal such as silicon single crystal during pulling of the single crystal. Thus, electrical properties of a device having the single crystal is deteriorated.

2) When vapors of SiO, $SiO_2$ and Si from the melt are deposited to and solidified on a heat insulator mounted on the outer surface of the cooled cylinder and fall into the melt, the melt (i.e., raw crystal) is contaminated and the progress of the monocrystallization process or conversion of raw crystal into single crystal is prevented. In addition, if graphite fiber is used for the heat insulator, the graphite fiber exposed to the vapors from the melt is deteriorated and is likely to slip off. As a result, progress of the monocrystallization process is prevented.

SUMMARY OF THE INVENTION

The present invention is made to eliminate the above-described drawbacks in the conventional single crystal pulling apparatuses and an object of the present invention is to provide a single crystal pulling apparatus using Czochralski method.

To achieve this object, the single crystal pulling apparatus of the present invention comprises a first screen in the shape of a hollow cylinder, the first screen having one side made of a heat absorbent material which faces a quartz crucible and another side made of a heat insulator material, top and bottom ends of the first screen having an outwardly extending flange and an inwardly extending flange, respectively, the inwardly extending flange being positioned in the crucible near a melt charged zone and surrounding a single crystal pulling region; and the apparatus further comprises a second screen provided inside the first screen, the second screen having a parabolic vertical section with an opening at a central area which surrounds the single crystal pulling zone, the top end of the second screen having an outwardly extending flange.

In to a modification of the present invention, the second screen provided inside the first screen may have a vertical section similar to that of the first screen.

In addition, the second section may be provided with a cooling device for forced cooling.

According to the first aspect of the present invention, the first screen having the annular flanges is positioned closer to a heater, the melt and the wall of the quartz crucible than a screen of a conventional apparatus so that the first screen blocks radiant heat at a position closer to the heat sources. One side of the first screen facing the crucible is coated with SiC or $Si_3N_4$ of a high heat absorbency so that it is held to be at a high temperature, thereby preventing vapors from the silicon melt from being deposited on the first screen.

The second screen with the parabolic vertical section upwardly reflects the absorbed radiant heat and the heat radiated at and around the solid-liquid interface by the effect of its solid angle and also reflects the heat radiated from a grown zone of the grown crystal provided above the level of the solid-liquid interface.

The second screen with the vertical section similar to that of the first screen insulates heat from the heater and the melt at a position closer to these heat sources.

By the cooling device provided at the second screen, the heat radiated from the grown crystal is readily absorbed in the second screen and dissipated outside the apparatus, thereby to efficiently cool the grown crystal.

Another object of the present invention is to provide a single crystal pulling apparatus using Czocharalski method capable of increasing the pulling speed of a grown crystal and improving the preventive degree of dislocation for the grown crystal due to contamination of a crystal with impurities.

To achieve this object, the single crystal pulling apparatus according to the second aspect of the present invention comprises a first screen with a diameter reducing toward downwards and having openings at upper and lower ends, the first screen surrounding a single crystal pulling zone such that the lower end of the first screen is positioned near a melt charged zone in a crucible; and the apparatus further comprises a second screen of heat absorbent and heat conductive material provided inside the first screen, the second screen having the shape of a hollow round cylinder or hollow polygonal cylinder with the sidewall thereof being provided with air holes and the upper and lower ends thereof being open, the second screen being arranged such that the lower end thereof extends to near the lower end of the first screen and the upper end thereof extends to the wall of a pull chamber.

In a preferable modification to the apparatus, the upper and the lower ends of the first screen are provided with an outwardly extending flange and an inwardly extending flange, respectively.

Preferably, the second screen may be provided with a cooling device for forced cooling.

In addition, one surface of the first screen facing the crucible may be made of a heat absorbent material and another surface may be made of a heat insulating material.

In accordance with the second aspect of the present invention, the first screen is designed to be heated to a high temperature by making its melt side surface of a high heat-absorbent carbon or a carbon with the surface thereof being coated with SiC or $Si_3N_4$. In addition, the surface of the first screen facing the second screen may be made of a heat insulating material so as to prevent heat radiated from the heater and the crucible from reaching to the second screen and the single crystal.

By making the second screen of a high heat-absorbent carbon or carbon with the surface being coated with SiC or $Si_3N_4$, the second screen absorbs heat radiated from the grown crystal and transmits it to other elements.

The cooling device provided at the second screen dissipates heat from the grown crystal by means of a coolant.

DESCRIPTION OF THE PREFERRED EMBODIMENTS

The preferred embodiments of the present invention will be described with reference to the drawings.

EMBODIMENT 1

Figure 1:
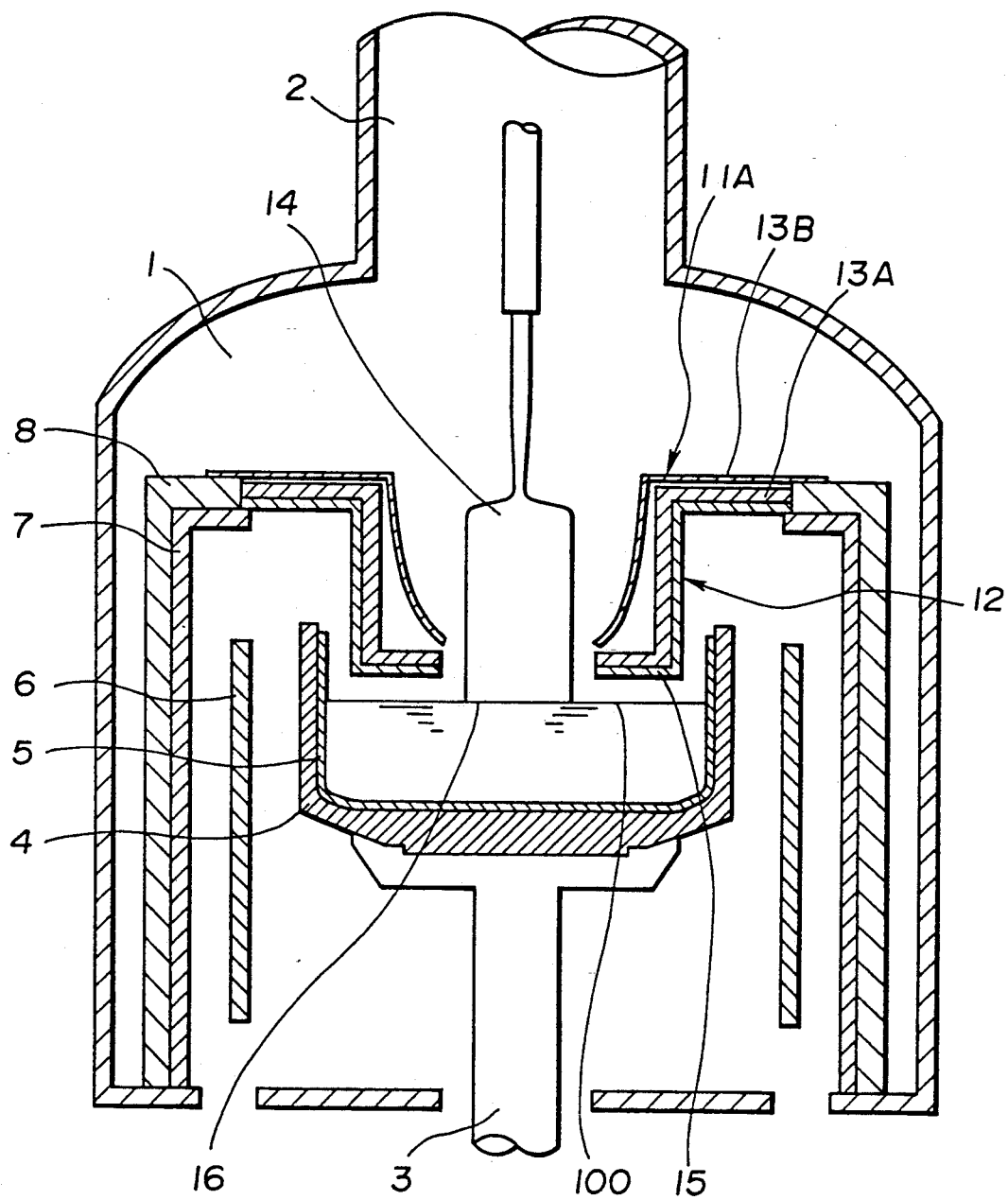
FIG. 1 illustrates a longitudinal section of a single crystal pulling apparatus of the first embodiment of the present invention.

FIG. 1 illustrates a single crystal pulling apparatus of the embodiment 1 of the present invention.

A main chamber 1 has a pull chamber 2 provided above the chamber 1. The main chamber 1 receives a vertically movable rotatable shaft 3 passing thereinto through the center of the bottom of the main chamber 1. The upper end of the rotatable shaft 3 has a carbon crucible or protective vessel 4 fastened thereto. The protective vessel 4 protects a quartz crucible 5 mounted therewithin.

A tubular carbon insulator 7 surrounds the protective vessel 4 and blocks heat radiation from a tubular carbon heater 6 to the sidewall of the main chamber 1. A protective tube 8 of carbon felt shielding the tubular insulator 7 surrounds the outer cylindrical surface of the tubular insulator 7.

A first screen 12 in the shape of a substantially hollow round cylinder is fastened to the protective tube 8 so that the outer edge of an angular, radially outwardly extending flange 13A provided on the upper end of the first screen 12 is fastened to the upper end of the protective tube 8. The first screen 12 passes downwards into the quartz crucible 5 along the sidewall thereof so that the lower end of the first screen 12 extends to near the surface 100 of a melt. The lower end of the first screen 12 has an annular flange 15 lying above the melt surface 100 and radially inwardly extending to near a grown single crystal 14. A side of the first screen 12 facing the quartz crucible 5 is made of a carbon 12A coated with silicon carbide (SiC), a heat absorbent of a high coefficient of heat radiation of 0.5–0.8. Since heat radiation from the melt surface 100, the sidewall of the quartz crucible 5 and the heater 6 heats the first screen 12 itself to a high temperature, vapors of SiO, $SiO_2$ and/or Si from the melt surface 100 cannot be deposited to the first screen 12. The first screen 12 has the shape of a substantially hollow round cylinder and is positioned near the heat sources so as to efficiently block heat radiated from the heat sources.

In addition, a grown crystal side of the first screen 12 is made of an insulator 12B of carbon felt so as to efficiently insulate the grown crystal from the large heat sources of the melt surface 100, the sidewall of the crucible 5 and the heater 6.

A second screen 11A is made of carbon and has a longitudinal section in the shape of a substantially parabola. The second screen 11A is fastened to the upper end of the protective tube 8 by means of an annular, radially outwardly extending flange 13B provided on the upper end of the second screen 11A as the first screen 12 is. The temperature profile or distribution of the grown single crystal 14 is essentially exponentially reduced in the upward direction away from the solid-liquid interface 16. Single crystal growth speed depends largely on in-crystal temperature gradient at growth interface. Thus, the parabolic longitudinal section of the second screen 11A which has a smaller solid angle for the surface of a single crystal produced at a growth interface than a longitudinal section of the second screen 11A in the shape of an inverted cone so that the second screen 11A efficiently upwardly reflects heat radiated from the surface of the grown crystal produced at the solid-liquid interface or efficiently absorbs and discards it. Thus, the temperature gradient at the growth interface can be increased.

Since the surface of the second screen 11A is continuously replaced with a fresh inert gas, neither it can be exposed to vapors of SiO, $SiO_2$ and/or Si from the melt, nor a deposition can fall from the surface of the second screen 11A into the melt.

With the apparatus of the embodiment 1, 30 kg of polycrystal silicon was placed in a quartz crucible with an about 340-mm diameter and a 250-mm depth, and pulling conventionally a single crystal with an about 100-mm diameter produced an about 1250-mm long single crystal at a high speed of 1.9–2.0 mm/min at a high reproducibility.

In addition, the apparatus of the embodiment 1 reduced a crystal defect and a concentration of oxygen, increased the pulling speed and saved an energy.

Figure 5:
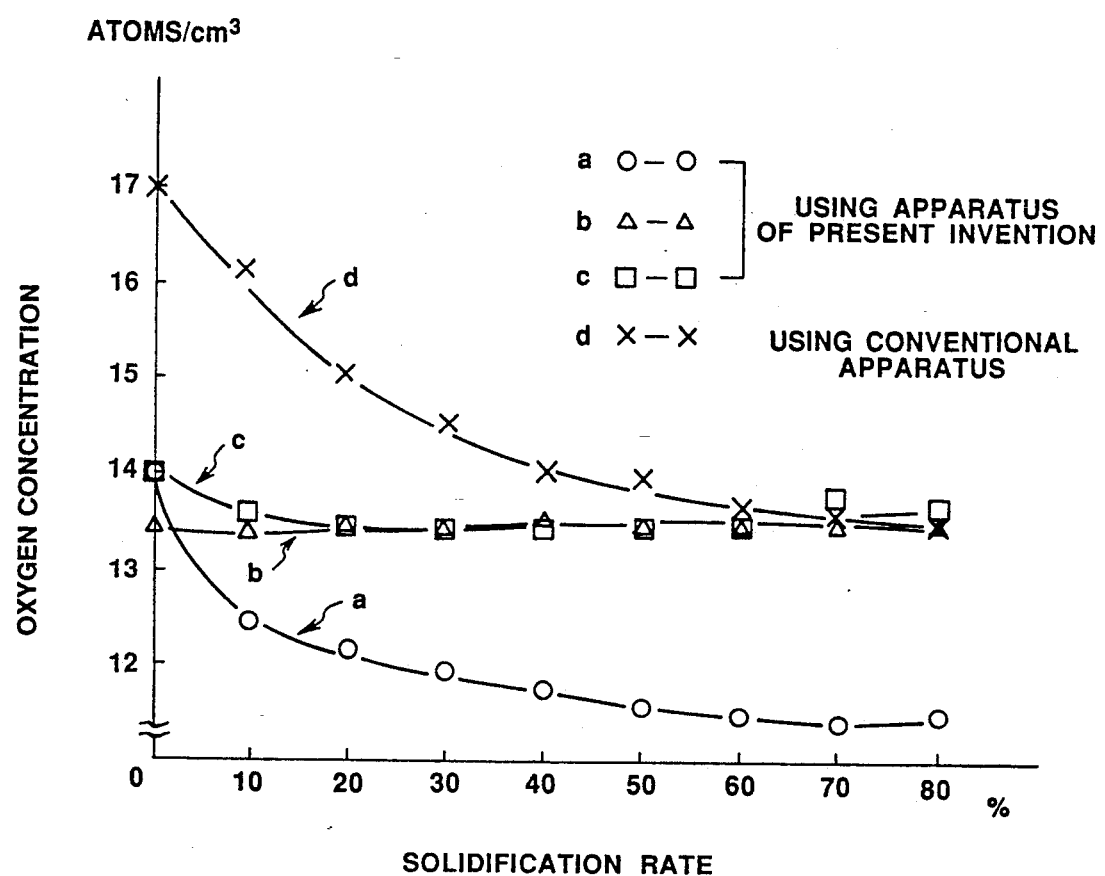
FIG. 5 is a graph of concentrations of oxygen with respect to solidification rate of a silicon single crystal pulled by inventive and conventional single crystal pulling apparatuses.

Curve a of FIG. 5 represents a property of a silicon single crystal pulled by the apparatus of the embodiment 1.

In the embodiment 1, the second screen 11A is made of carbon. However, it may be made of a metal such as molybdenum.

EMBODIMENT 2

Figure 2:
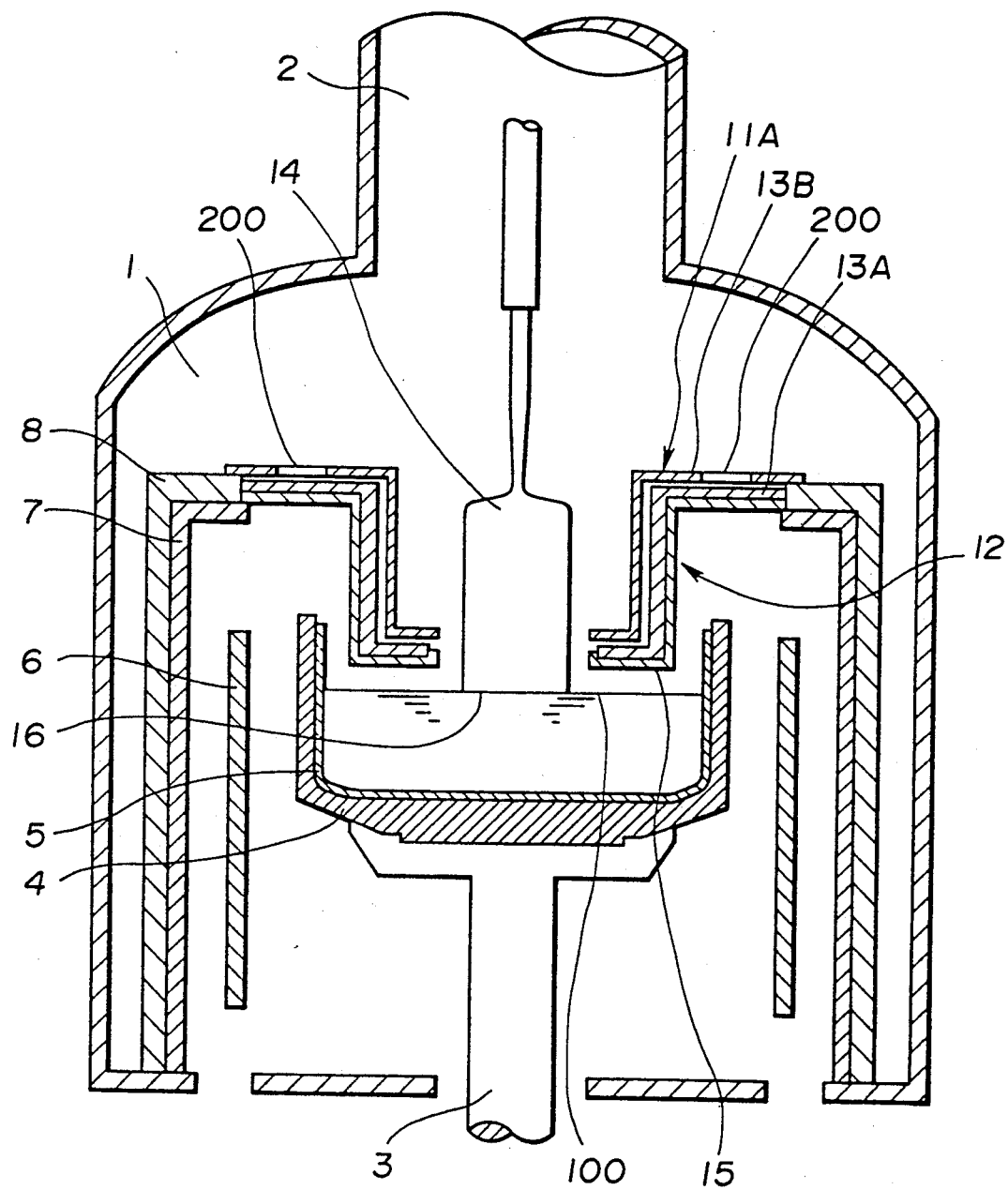
FIG. 2 illustrates a longitudinal section of a single crystal pulling apparatus of the second embodiment of the present invention.

FIG. 2 The embodiment 2 of the present invention will be described hereinafter. In the description of the embodiment 2, the same components as those of the embodiment 1 have the same labels and descriptions there of will not be repeated.

A single crystal pulling apparatus of the embodiment 2 is different from that of the embodiment 1 mainly in that a second screen 11B of the embodiment 2 does not have an essentially parabolic vertical or longitudinal section but a vertical section similar to that of a first screen 12. The shape of the vertical section of the second screen 11B of the embodiment 2 blocks heat radiated from the heat sources of the heater 6, the crucible 5 and the melt to the grown crystal, in a position near the heat sources so as to increase the insulating operation of the second screen 11B. An annular flange 13B provided on the upper end of the second screen 11B has an air hole 200 for introducing a fresh inert gas into a spacing between the first screen 12 and the second screen 11B. The function of this arrangement is to pass the fresh inert gas through the spacing between the screens 12 and 11B so as to prevent a deposition of vapors from the melt surface 100.

With the apparatus of the embodiment 2, 30 kg of polycrystal silicon was placed in a quartz crucible with an about 340-mm diameter and a 250-mm depth and pulling conventionally a single crystal with an about 100-mm diameter produced an about 1250-mm long single crystal at a high speed of 1.9–2.0 mm/min at a high reproducibility. In addition, the apparatus of the embodiment 2 reduced a crystal defect and a concentration of oxygen, increased the pulling speed and saved an energy.

Curve b of FIG. 5 represents a property of a silicon single crystal pulled by the apparatus of the embodiment 2.

EMBODIMENT 3

Figure 3:
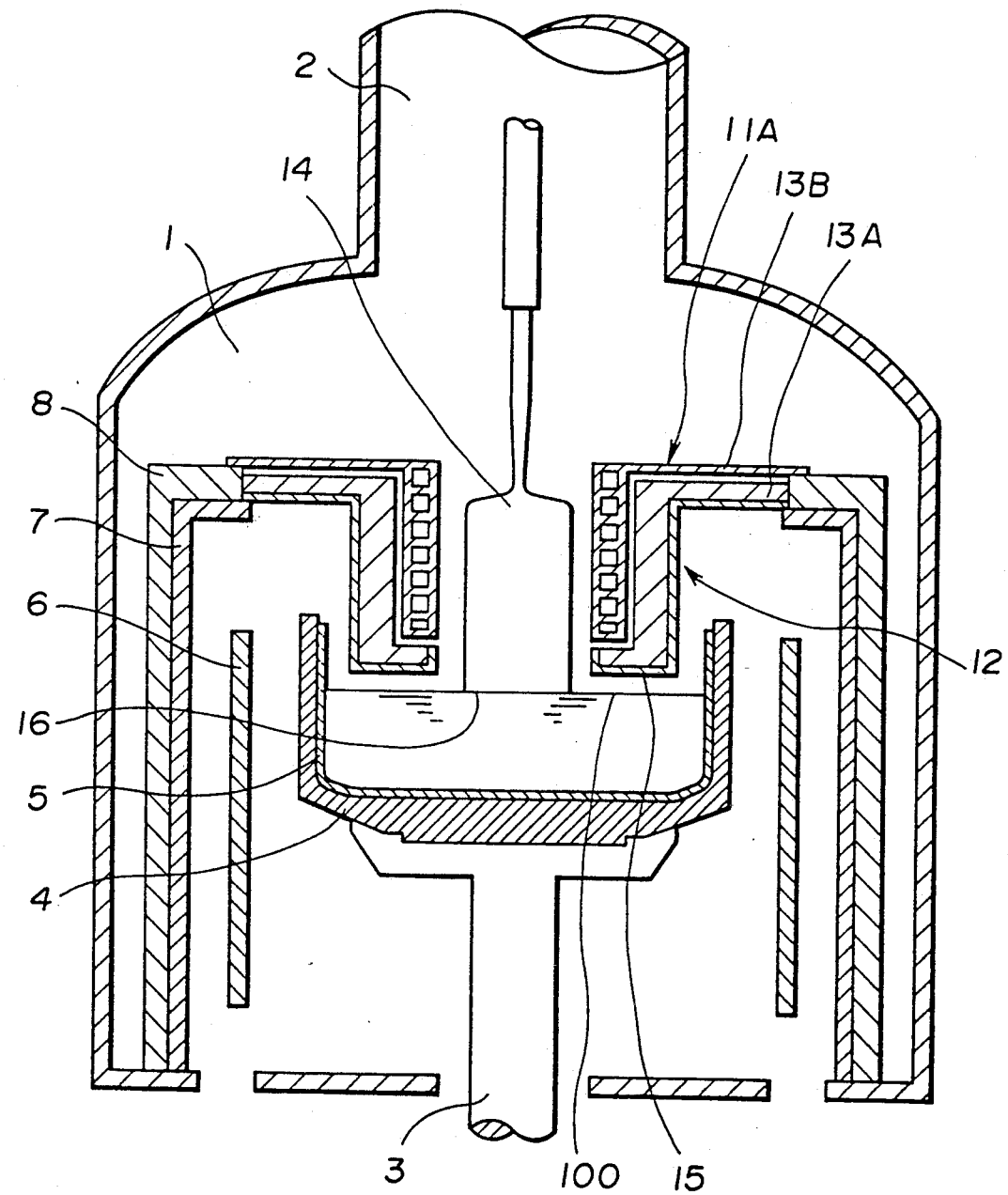
FIG. 3 illustrates a longitudinal section of a single crystal pulling apparatus of the third embodiment of the present invention.

FIG. 3 The embodiment 3 of the present invention will be described hereinafter. In the description of the embodiment 3, the same components as those of the embodiment 1 have the same labels and descriptions thereof will not be repeated.

A single crystal pulling apparatus of the embodiment 3 comprises a second screen 11C with a vertical section in the shape of inverted L. The second screen 11C is made of a carbon which is high heat-absorbent and has a high coefficient of heat radiation. The interior of the sidewall of the second screen 11C has the structure of a cooling jacket through which a gas coolant passes to cool the second screen 11C. Thus, the second screen 11C forcedly cools a grown crystal to increase the growth speed of the grown single crystal 14.

With the apparatus of the embodiment 2, 30 kg of polycrystal silicon was placed in a quartz crucible with an about 340-mm diameter and a 250-mm depth and pulling conventionally a single crystal with an about 100-mm diameter produced an about 1250-mm long single crystal at a high speed of 2.5–2.6 mm/min at a high reproducibility.

In addition, the apparatus of the embodiment 3 reduced a crystal defect and a concentration of oxygen, increased the pulling speed and saved an energy.

EMBODIMENT 4

Figure 4:
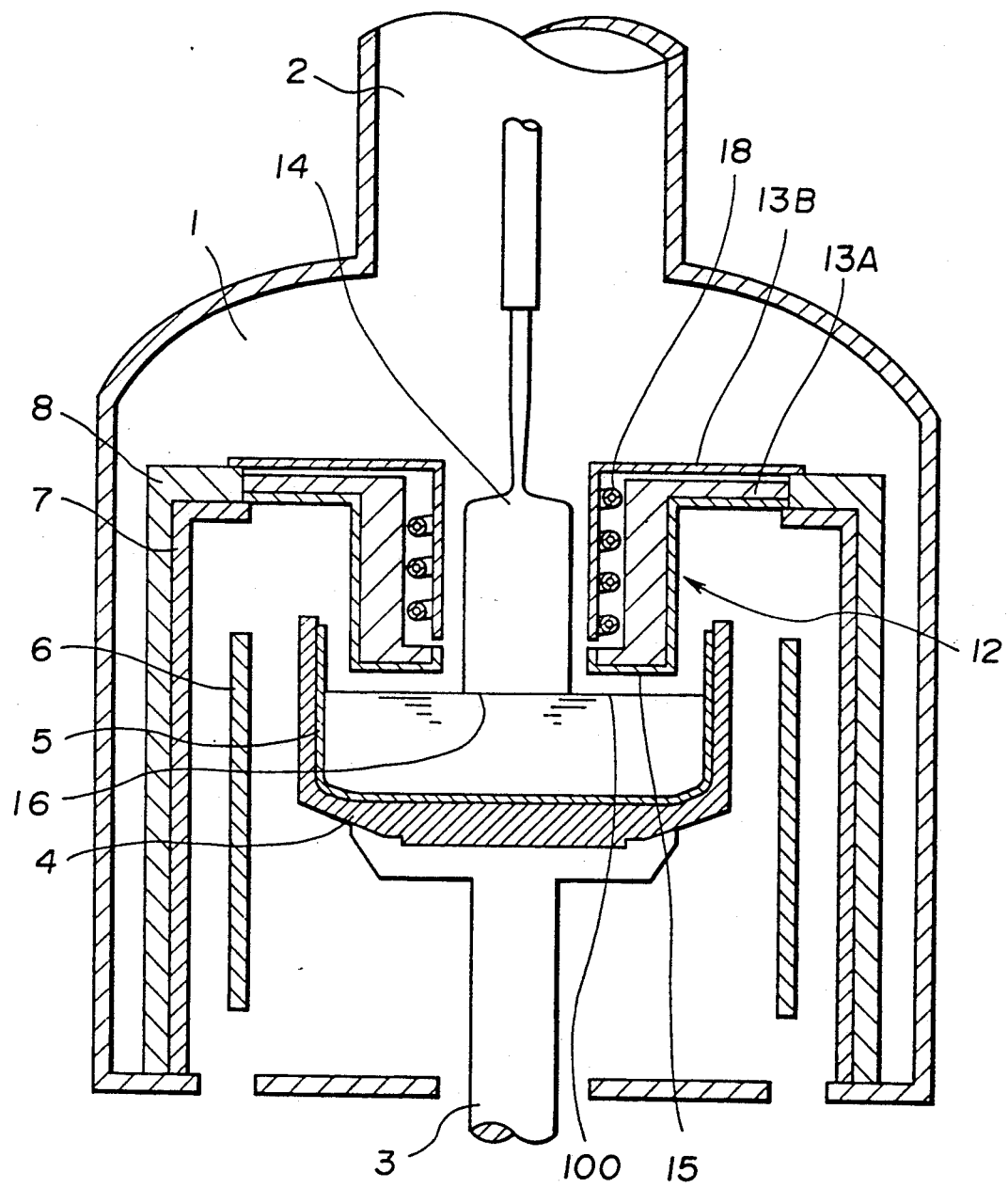
FIG. 4 illustrates a longitudinal section of a single crystal pulling apparatus of the fourth embodiment of the present invention.

FIG. 4 illustrates a single crystal pulling apparatus of the embodiment 4. The apparatus comprises a second screen 11B having a high coefficient of heat radiation and a vertical section in the shape of inverted L. A forced cooling system for the second screen 11B comprises a pipe 18 wound around the outer cylindrical surface of the body of the second screen 11B through which pipe water or a gas coolant passes.

In comparison, curve d of FIG. 5 represents a property of a silicon single crystal pulled by a conventional single crystal pulling apparatus under the same conditions as those of embodiments 1–4.

In embodiments 1–4, the first and second screens are positioned with a small spacing therebetween. This spacing precludes heat conduction from the first screen to the second screen to efficiently block heat radiated from the heat sources to the grown crystal. When the annular flange of the second screen defines the air hole for conducting fresh argon into the spacing between the first and second screens, the spacing is continuously held clean, so that the surfaces of the screens will not be exposed to the vapors of SiO, $SiO_2$ and/or Si from the melt even if the surfaces of the screens are at low temperatures. Thereby, neither the vapors can be deposited nor then a deposition to result can fall into the melt to block the monocrystallization.

EMBODIMENT 5

Figure 6:
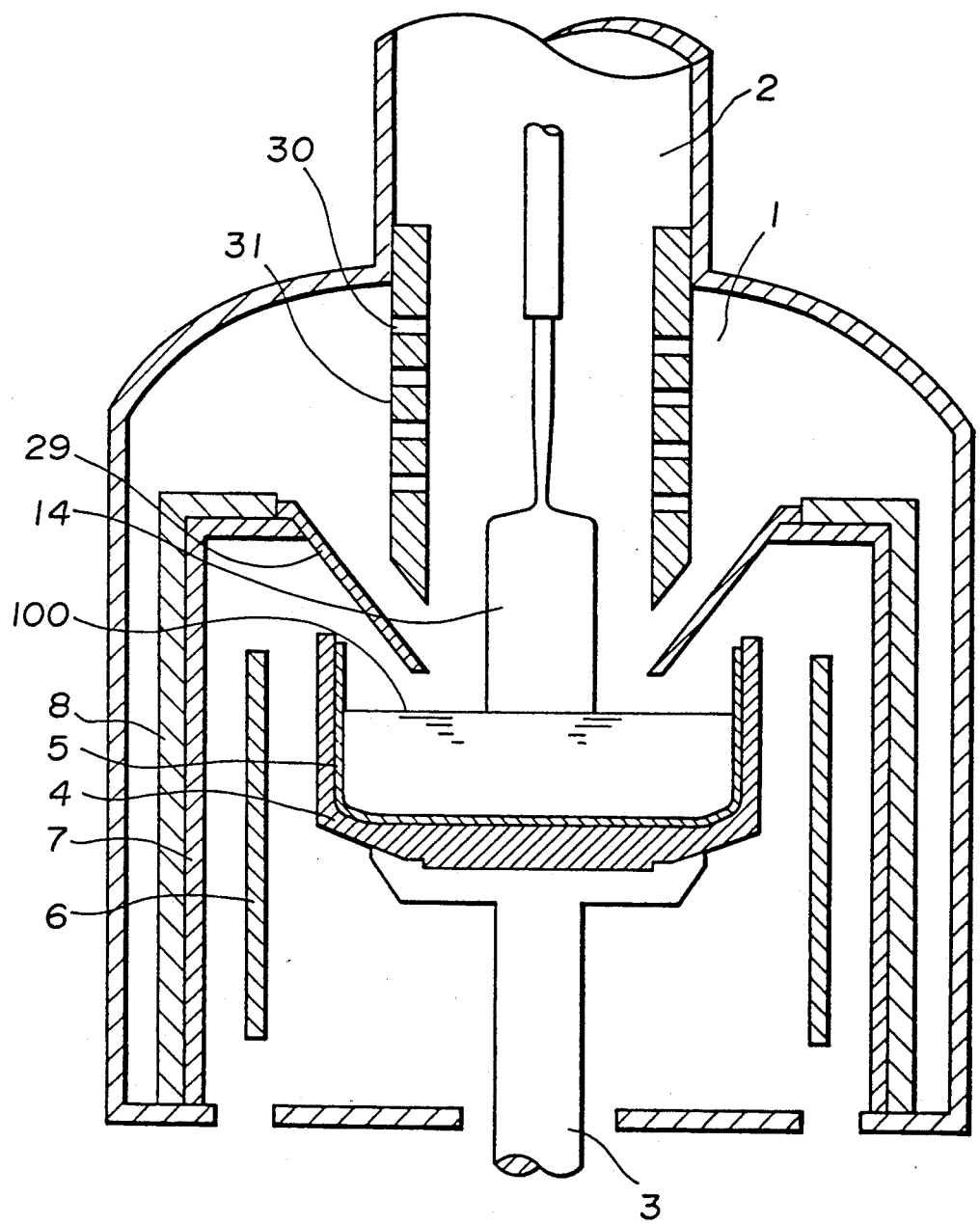
FIG. 6 illustrates a longitudinal section of a single crystal pulling apparatus of the fifth embodiment of the present invention.

FIG. 6 illustrates a single crystal pulling apparatus of the embodiment 5.

The apparatus comprises a first screen 29 surrounding a grown single crystal 14 and having surfaces tapering downwards, and a second screen 31 in the shape of hollow round cylinder provided inside the first screen 29.

The upper end of the first screen 29 is supported on a protective tube 8 and the lower end of the first screen 29 is positioned in a crucible 5 near the melt surface 100.

The second screen 31 is arranged inside the first screen 29 so that the wall of the second screen 31 defines air through-holes 31, the open end of the second screen 31 is fastened to the water cooled inner wall surface of a pull chamber 2 and the lower end of the second screen 31 extends to near the lower end of the first screen 29.

The first screen 29 is made of a carbon of a high coefficient of heat radiation of 0.5–0.8. The second screen 31 is made of a carbon of a high heat absorbency, high heat conductivity and high coefficient of heat radiation.

Arrangements of the other components of the apparatus of the embodiment 5 are essentially identical to those of a conventional single crystal pulling apparatus. Specifically, a main chamber 1 has a pull chamber 2 provided above the chamber. The main chamber 1 receives a vertically movable rotatable shaft 3 passing thereinto through the center of the bottom of the main chamber 1. The top end of the rotatable shaft 3 has a protective vessel 4 of carbon fastened thereto. The protective vessel 4 protects a quartz crucible 5 mounted therewithin.

A tubular carbon insulator 7 surrounds the protective vessel 4 and blocks heat radiation from a tubular carbon heater 6 to the sidewall of the main chamber 1. A protective tube 8 of carbon felt shielding the tubular insulator 7 surrounds the outer cylindrical surface of the tubular insulator 7.

In accordance with the above arrangement, the first screen 29 receives heat radiated from the melt surface 100 to be heated to a high temperature so that vapors of SiO, $SiO_2$ and/or Si from the melt cannot be deposited to the surface of the first screen 29. The first screen 29 also blocks heat radiated from the sidewall of the crucible 5 and the heater 6.

A fresh inert gas fed through an upper portion of the pull chamber 2 and passing through the air holes 30 defined in the wall of the second screen 31 continuously purges a zone formed above the first screen 29 of an old gas, so that vapors of SiO, $SiO_2$ and/or Si from the melt cannot go to the first screen 29 and therefore, the vapors cannot be deposited to the first screen 29 even if the first screen 29 is at a low temperature.

Since the second screen 31 is made of the high heat-conductive material as described above, it absorbs heat radiated from the grown crystal and discards it by conduction to the inner wall surface of the pull chamber 2 to promote to cool the grown single crystal 14.

With the apparatus of the embodiment 5, 30 kg of polycrystal silicon was placed in a quartz crucible with an about 340-mm diameter and a 250-mm depth, and pulling conventionally a single crystal with an about 110-mm diameter produced an about 1250-mm long single crystal at a high speed of 1.9–2.1 mm/min at a high reproducibility.

As can be understood, the apparatus of the embodiment 5 can pull the grown crystal at a pulling speed faster than at 1.6–2.0 mm/min of a conventional single crystal pulling apparatus.

In addition, electrical properties of an electronic device with a silicon wafer made from this grown crystal were essentially identical to those of a conventional electronic device of the same kind.

EMBODIMENT 6

Figure 7A:
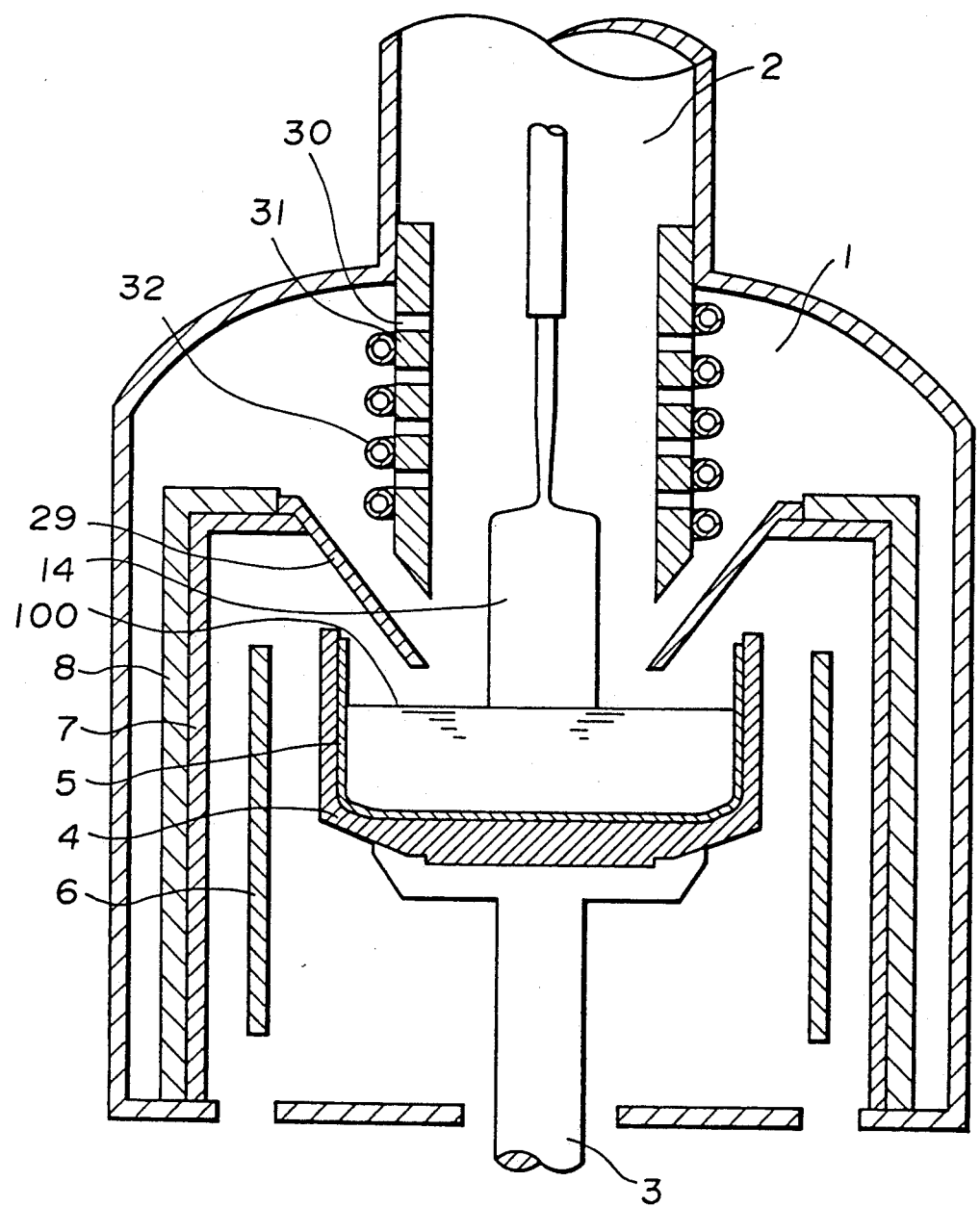
FIG. 7(a) illustrates a longitudinal section of a single crystal pulling apparatus of the sixth embodiment of the present invention.

The embodiment 6 will be described hereinafter. FIG. 7(a) illustrates a single crystal pulling apparatus of the embodiment 6. In the description of the embodiment 6, the same components as those of the embodiment 1 have the same labels and descriptions thereof will not be repeated.

A single crystal pulling apparatus of the embodiment 6 is different from that of the embodiment 5 mainly in that the apparatus of the embodiment 6 comprises a cooling pipe 32 wound around a second screen 31. Water passing through the cooling pipe 32 promotes to cool a grown crystal.

With the apparatus of the embodiment 6, 30 kg of polycrystal silicon was placed in a quartz crucible with an about 340-mm diameter and a 250-mm depth and pulling conventionally a single crystal with an about 110-mm diameter produced an about 1250-mm long single crystal at a high speed of 1.9-2.3 mm/min at a high reproducibility.

In addition, electrical properties of a device having a silicon wafer derived from the grown crystal were essentially equal to those of a conventional device.

Figure 7B:
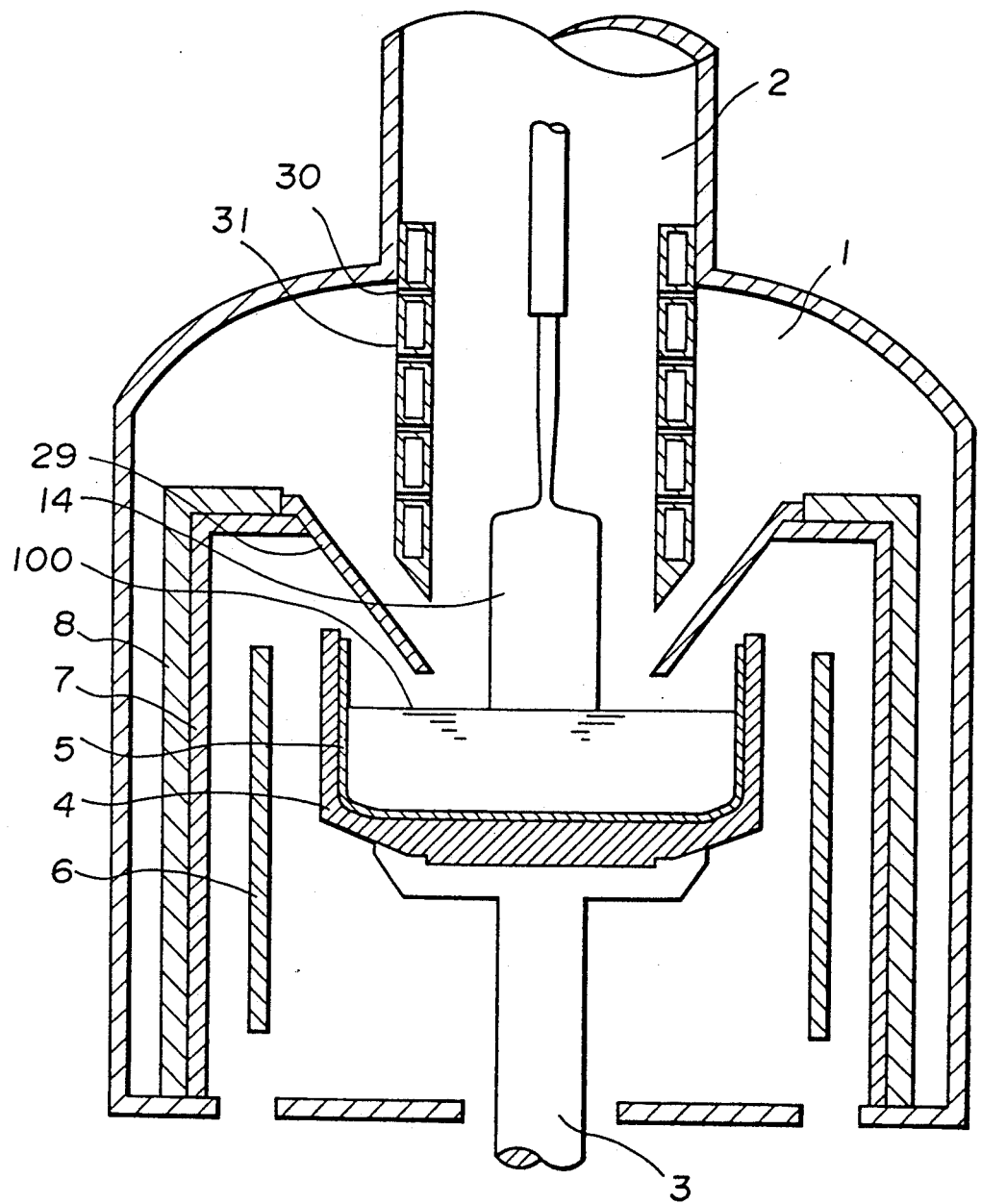
FIG. 7(b) illustrates a longitudinal section of a single crystal pulling apparatus of a modification of the sixth embodiment.
Figure 8:
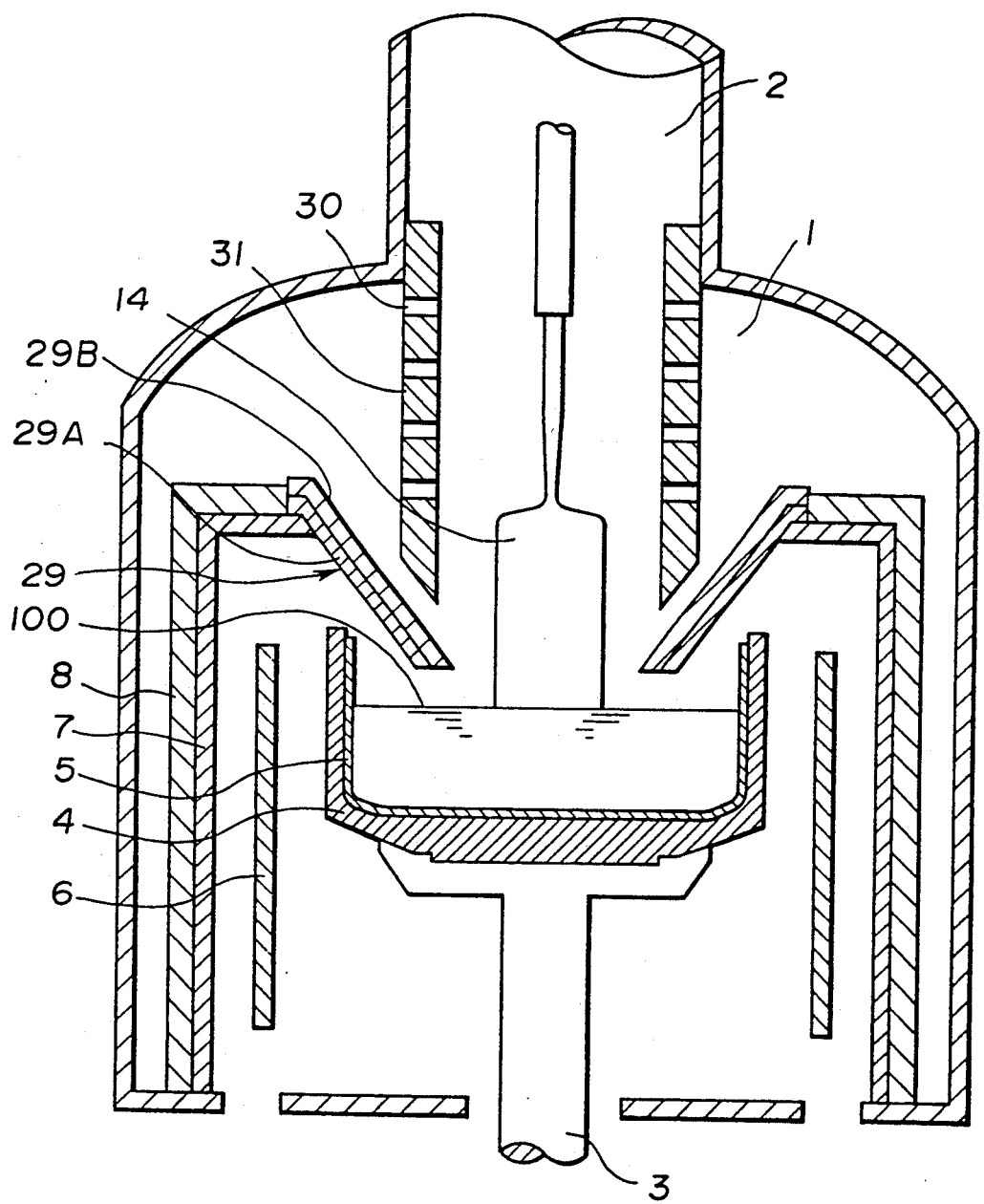
FIG. 8 illustrates a longitudinal section of a single crystal pulling apparatus of the seventh embodiment of the present invention.

As seen in FIG. 7(a), the embodiment 6 employs the cooling pipe 32 for cooling the second screen 31. However, the interior of the sidewall of the second screen 31 itself may contain the structure of a cooling jacket through which a liquid coolant passes to cool the grown crystal, as illustrated in FIG. 7(b).

EMBODIMENT 7

The embodiment 7 of the present invention will be described hereinafter. In the description of the embodiment 7, the same components as those of the embodiments 5 and 6 have the same labels and descriptions thereof will not be repeated.

A single crystal pulling apparatus of the embodiment 7 is different from those of embodiments 5 and 6 mainly in that a first screen 29 of the embodiment 7 comprises a double-layered structure of a carbon layer 29A (i.e., the external side of the first screen 29) which is positioned on the side of a crucible 5 and coated with SiC of a high heat-absorbency and a coefficient of heat radiation of 0.6-0.9, and a layer 29B of carbon fiber (i.e., the internal side of the first screen 29) which is positioned on the side of a grown single crystal 14.

This arrangement holds the crucible side of the first screen 29 at a high temperature while blocking heat radiated to the second screen 31 to promote to cool the grown crystal and increase the pulling speed.

With the apparatus of the embodiment 7, 30 kg of polycrystal silicon was placed in a quartz crucible with an about 340-mm diameter and a 250-mm depth, and pulling conventionally a single crystal with an about 110-mm diameter produced an about 1250-mm long single crystal at a high speed of 2.0-2.2 mm/min at a high reproducibility.

In addition, electrical properties of a device having a silicon wafer derived from the grown crystal were essentially equal to those of a conventional device.

EMBODIMENT 8

The embodiment 8 of the present invention will be described hereinafter. In the description of the embodiment 8, the same components as those of the embodiment 1 have the same labels and descriptions thereof will not be repeated.

Figure 9:
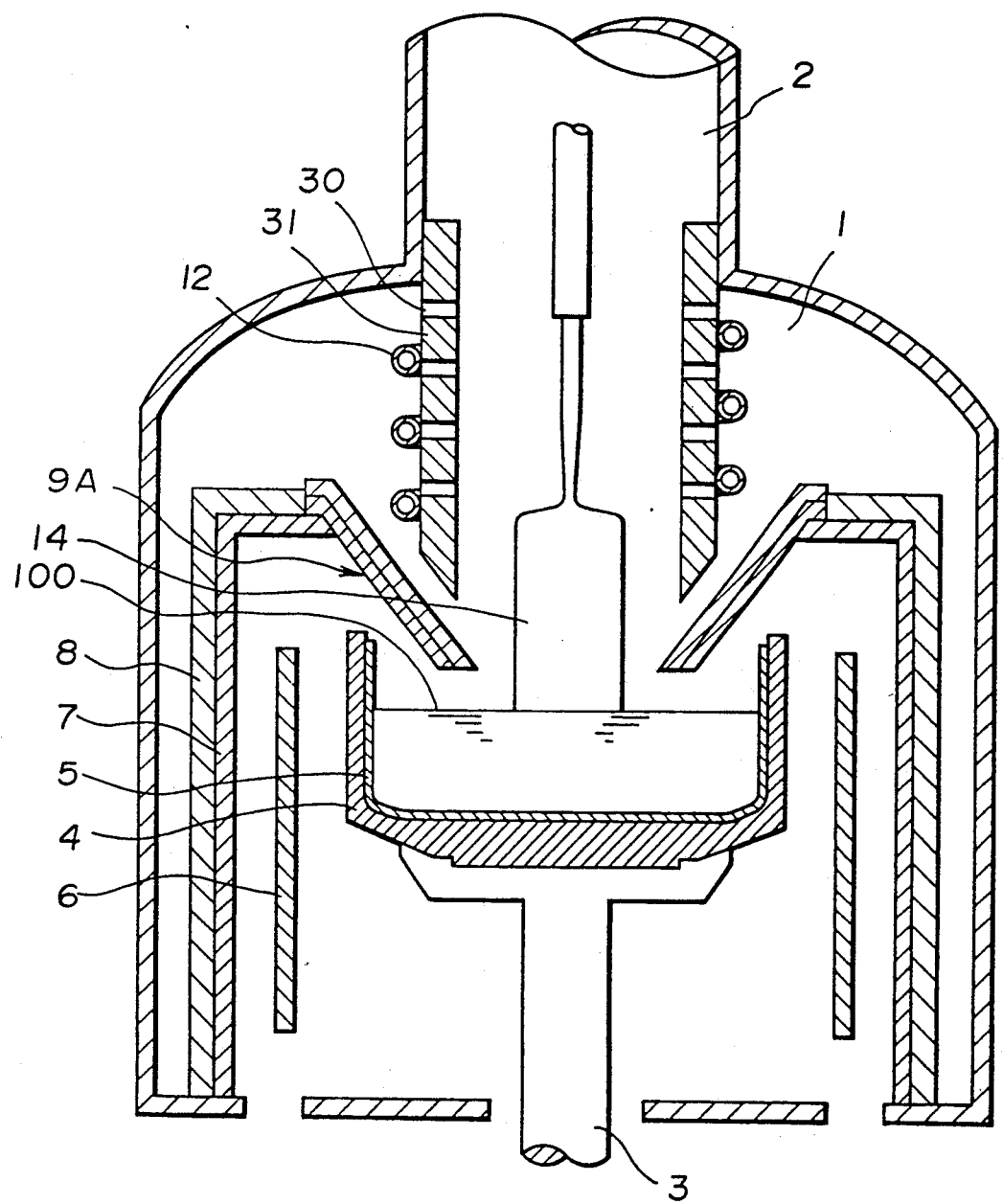
FIG. 9 illustrates a longitudinal section of a single crystal pulling apparatus of the eighth embodiment of the present invention.

As can be seen in FIG. 9, the single crystal pulling apparatus of the embodiment 8 comprises, in addition to the features of the embodiment 5, both the feature of the first screen 29 of the embodiment 7 comprising the double-layered structure of a carbon layer 29A (i.e., the external side of the first screen 29) which is positioned on the side of a quartz crucible 5 and coated with SiC of a high heat-absorbency and a coefficient of heat radiation of 0.6-0.9 and of a layer 29B of carbon fiber (i.e., the internal side of the first screen 29) which is positioned on the side of a grown single crystal 14 and the feature of the embodiment 6 having the cooling pipe 32 wound around the second screen 31.

As of the embodiment 7, the arrangement of the first screen 29 of the embodiment 8 holds the crucible side of the first screen 29 at a high temperature while blocking heat radiated to the second screen 31 to promote to cool the grown crystal.

With the apparatus of the embodiment 8, 30 kg of polycrystal silicon was placed in a quartz crucible with an about 340-mm diameter and a 250-mm depth, and pulling conventionally a single crystal with an about 110-mm diameter produced an about 1250-mm long single crystal at a high speed of 2.2-2.5 mm/min at a high reproducibility.

In addition, electrical properties of a device having a silicon wafer derived from the grown crystal were essentially equal to those of a conventional device.

EMBODIMENT 9

The embodiment 9 will be described hereinafter. In the description of the embodiment 9, the same components as those of the embodiments 1-4 have the same labels and descriptions thereof will not be repeated.

Figure 10:
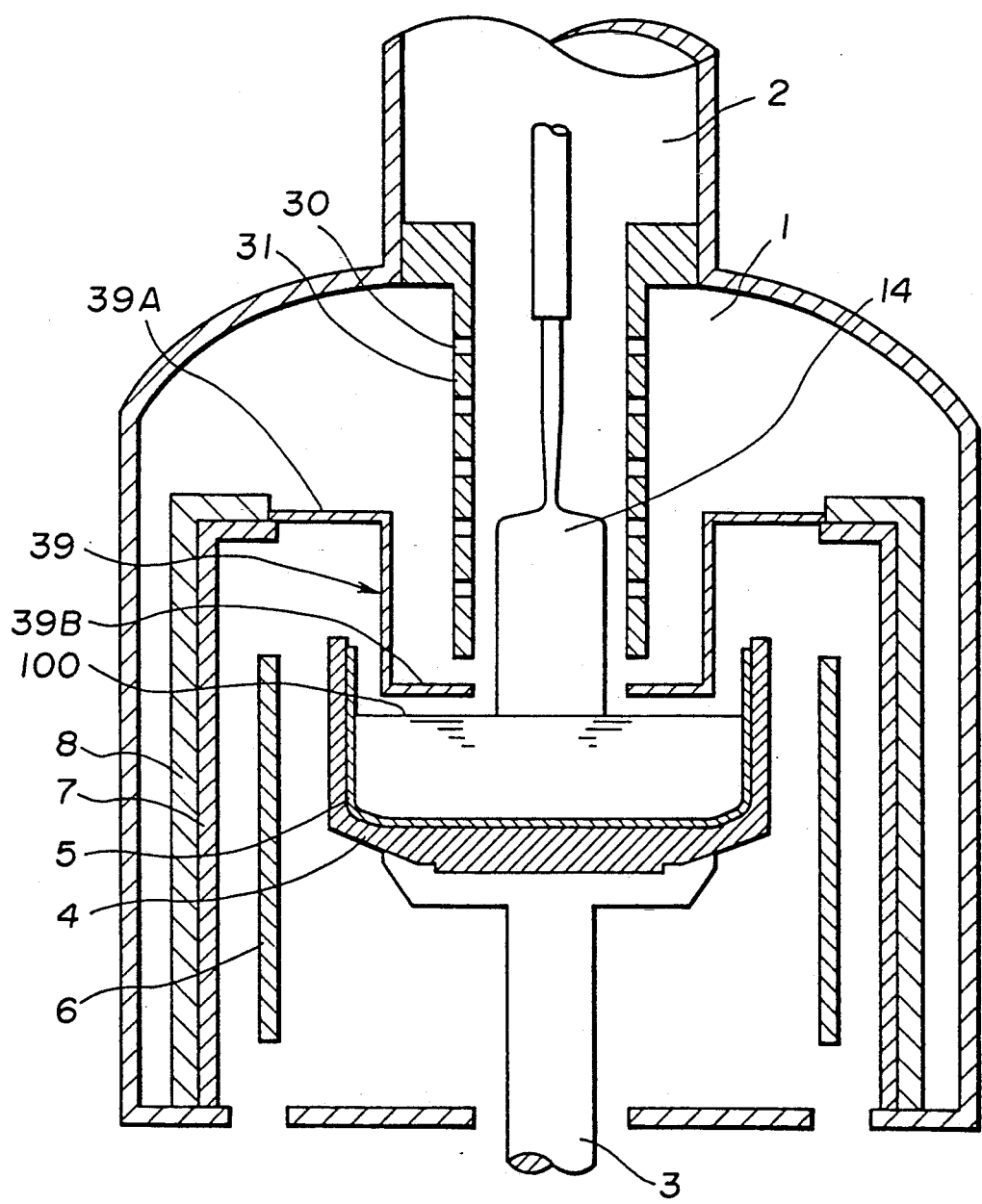
FIG. 10 illustrates a longitudinal section of a single crystal pulling apparatus of the ninth embodiment of the present invention.

As seen in FIG. 10, a single crystal pulling apparatus of the embodiment 9 is different from those of the embodiments 1-4 mainly in that a first screen 39 of the embodiment 9 is made of a single material and the body of the first screen 39 has the shape of an upright hollow round cylinder the respective upper and lower ends of which have an annular, radially outwardly extending flange 39A and an annular, radially inwardly extending flange 39B.

The first screen 39 is positioned so that the upper annular flange 39A is supported on a protective tube 8 and the lower annular flange 39B lies near the melt surface 100 thereabove.

A second screen 31 in the shape of hollow round cylinder vertically extends inside the first screen 39 so that the wall of the second screen 31 defines air holes 30 extending transversely therethrough. The upper end of the second screen 31 is fastened to the cooled inner wall surface of a pull chamber 2. The lower end of the second screen 31 extends to near the lower annular flange 39B of the first screen 39. The lower end of the second screen 31 of the embodiment 9 can extend to near the lower annular flange 39B of the first screen 39 since the body of the first screen 39 is in the shape of hollow round cylinder. Thus, the second screen 31 of the embodiment 9 is longer than those of the embodiments 1-8.

The first screen 39 is made of the carbon of the high coefficient of heat radiation of 0.5-0.8. The second screen 31 is made of the carbon of the high heat absorbency, high heat conductivity and high coefficient of heat radiation.

In accordance with the above arrangement, the first screen 39 receives heat radiated from the melt surface 100 to be heated to a high temperature so that vapors of SiO, $SiO_2$ and/or Si from the melt cannot be deposited to the surface of the first screen 39. The first screen 39 also blocks heat radiated from the sidewall of the crucible 5 and the heater 6. A fresh inert gas fed through an upper portion of the pull chamber 2 and passing through the air holes 30 defined in the wall of the second screen 31 continuously purges a zone formed above the first screen 39 of an old gas, so that the vapors of SiO, $SiO_2$ and/or Si from the melt cannot go to the first screen 39 and therefore, the vapors cannot be deposited to the first screen 39 even if the first screen 39 is at a low temperature. In addition, the body of the first screen 39 has the shape of the hollow, round cylinder extending along the sidewall of the crucible 5, the first screen 39 blocks heat radiated from the heat sources of the heater 6, the melt surface 100 and the sidewall of the crucible 5 in a position near them to promote to cool the grown single crystal 14.

Since the second screen 31 is made of the high heat-conductive material as described above, it absorbs heat radiated from the grown single crystal 14 and discards it by conduction to the inner wall surface of the pull chamber 2 to promote to cool the grown single crystal 14. In addition, the second screen 31 of the embodiment 9 is longer than those of the embodiments 1–8 so as to promote to cool the grown single crystal 14.

With the apparatus of the embodiment 9, 30 kg of polycrystal silicon was placed in a quartz crucible with an about 340-mm diameter and a 250-mm depth, and pulling conventionally a single crystal with an about 110-mm diameter produced an about 1250-mm long single crystal at a high speed of 1.9–2.1 mm/min at a high reproducibility. In addition, electrical properties of a device having a silicon wafer derived from the grown single crystal were essentially equal to those of a conventional device.

EMBODIMENT 10

A single crystal pulling apparatus the embodiment 10 will be described hereinafter. In the description of the embodiment 10, the same components as those of the embodiment 9 have the same labels and descriptions thereof will not be repeated.

The single crystal pulling apparatus of the embodiment 10 is different from that of the embodiment 9 mainly in that a second screen 31 of the embodiment 10 has a cooling pipe 32 wound around a second screen 32. Water passing through the cooling pipe 32 promotes to cool a grown single crystal 14.

With the apparatus of the embodiment 10, 30 kg of polycrystal silicon was placed in a quartz crucible with an about 340-mm diameter and a 250-mm depth, and pulling conventionally a single crystal with an about 110-mm diameter produced an about 1250-mm long single crystal at a high speed of 1.9–2.3 mm/min at a high reproducibility.

In addition, electrical properties of a device having a silicon wafer derived from the grown single crystal were essentially equal to those of a conventional device.

EMBODIMENT 11

A single crystal pulling apparatus of the embodiment 11 be described hereinafter. In the description of the embodiment 11, the same components as those of the embodiments 9 and 10 have the same labels and descriptions thereof will not be repeated.

Figure 12:
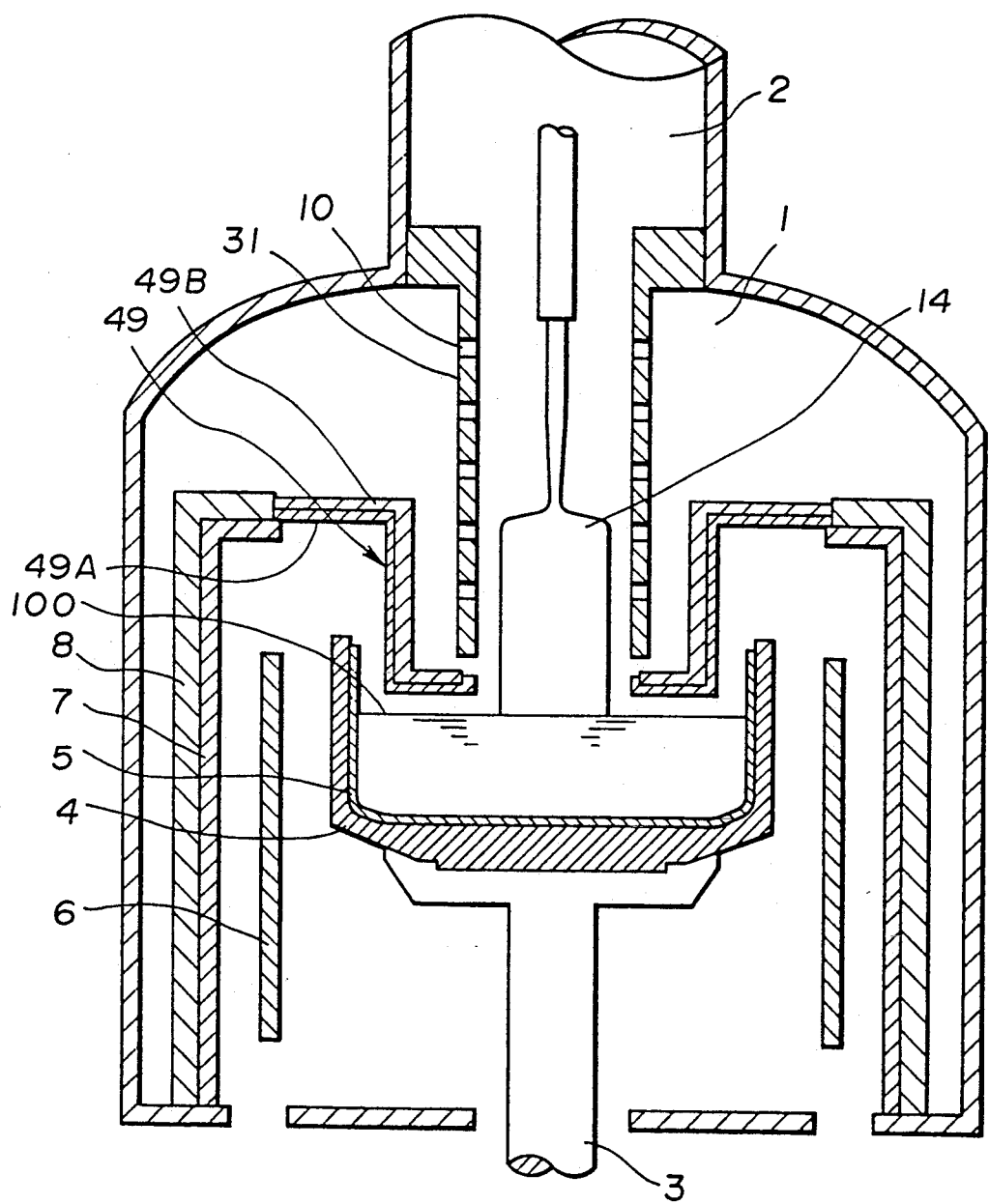
FIG. 12 illustrates a longitudinal section of a single crystal pulling apparatus of the eleventh embodiment of the present invention.

As seen in FIG. 12, a single crystal pulling apparatus of the embodiment 11 is different from that of the embodiment 9 mainly in that a first screen 39 of the embodiment 11 comprises a double-layered structure of a carbon layer 49A (i.e., the external side of the first screen 39) which is positioned on the side of a crucible 5 and coated with SiC of a high heat-absorbency and a coefficient of heat radiation of 0.6–0.9, and a layer 49B of carbon fiber (i.e., the internal side of the first screen 39) which is positioned on the side of a grown single crystal 14.

This arrangement holds the crucible side of the first screen 49 at a high temperature while blocking heat radiated to the second screen 31 to promote to cool the grown single crystal 14 and increase the pulling speed.

With the apparatus of the embodiment 11, 30 kg of polycrystal silicon was placed in a quartz crucible with an about 340-mm diameter and a 250-mm depth, and pulling conventionally a single crystal with an about 110-mm diameter produced an about 1250-mm long single crystal at a high speed of 2.0–2.2 mm/min at a high reproducibility.

In addition, electrical properties of a device having a silicon wafer derived from the grown single crystal were essentially equal to those of a conventional device.

EMBODIMENT 12

A single crystal pulling apparatus of the embodiment 12 will be described hereinafter. In the description of the embodiment 12, the same components as those of the embodiments 9–11 have the same labels and descriptions thereof will not be repeated.

Figure 13:
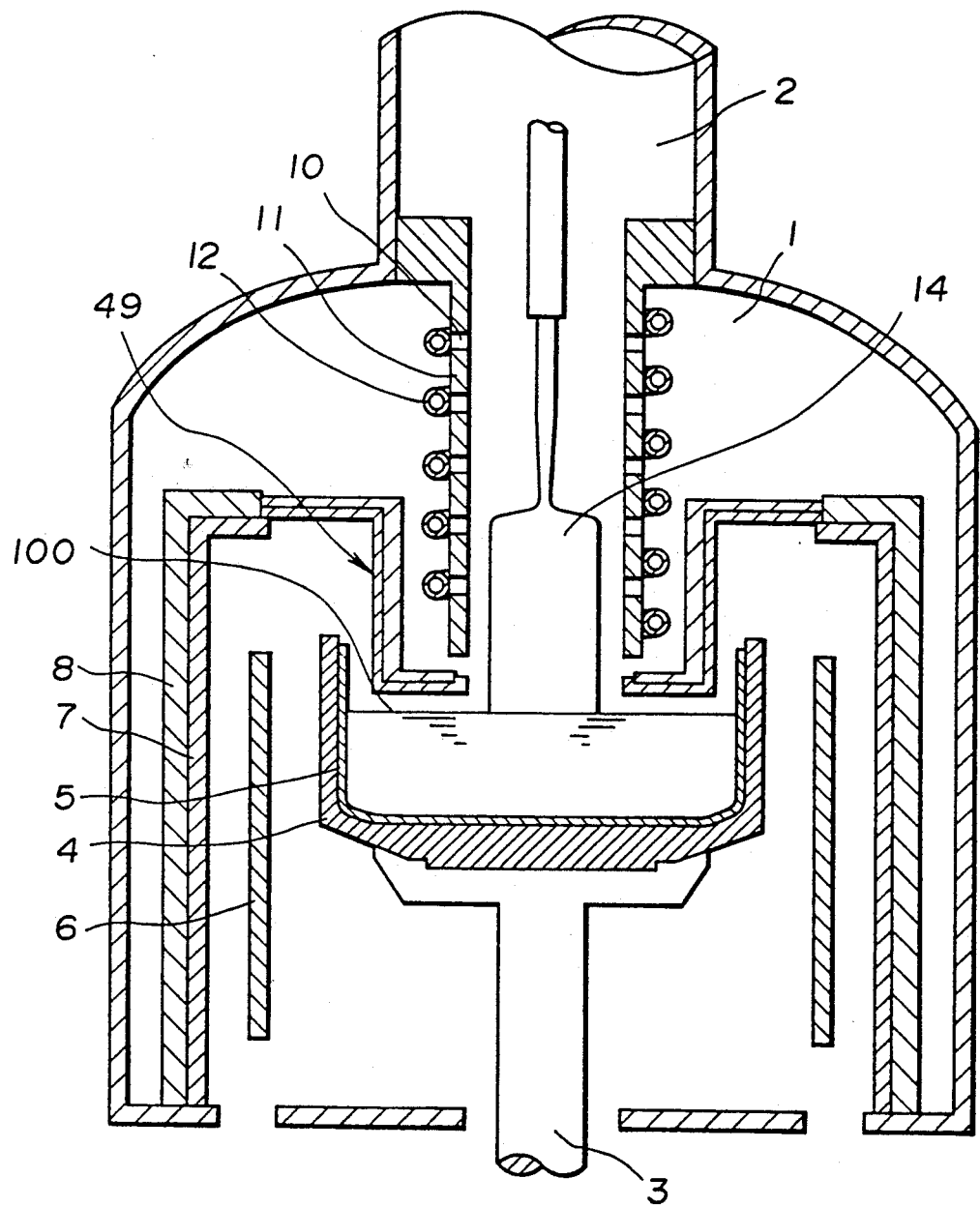
FIG. 13 illustrates a longitudinal section of a single crystal pulling apparatus of the twelves embodiment of the present invention.

As can be seen in FIG. 13, the single crystal pulling apparatus of the embodiment 12 comprises in addition to the features of the embodiment 11 a cooling pipe 32 wound around a second screen 31.

As of the embodiment 11, the arrangement of the first screen 31 of the embodiment 12 holds the crucible side of the first screen 31 at a high temperature while blocking heat radiated to the second screen 31 to cool the grown single crystal 14. In addition, the cooling pipe 32 wound around the second screen 31 promotes to cool the grown single crystal 14. The operations of the first screen and the cooling pipe 32 enable to increase the pulling speed.

With the apparatus of the embodiment 12, 30 kg of polycrystal silicon was placed in a quartz crucible with an about 340-mm diameter and a 250-mm depth, and pulling conventionally a single crystal with an about 110-mm diameter produced an about 1250-mm long single crystal at a high speed of 2.2–2.5 mm/min at a high reproducibility.

In addition, electrical properties of a device having a silicon wafer derived from the grown single crystal were essentially equal to those of a conventional device.

EMBODIMENT 13

A single crystal pulling apparatus of the embodiment 13 will be described hereinafter. In the description of the embodiment 13, the same components as those of the embodiments 9–12 have the same labels and descriptions thereof will not be repeated.

Figure 11:
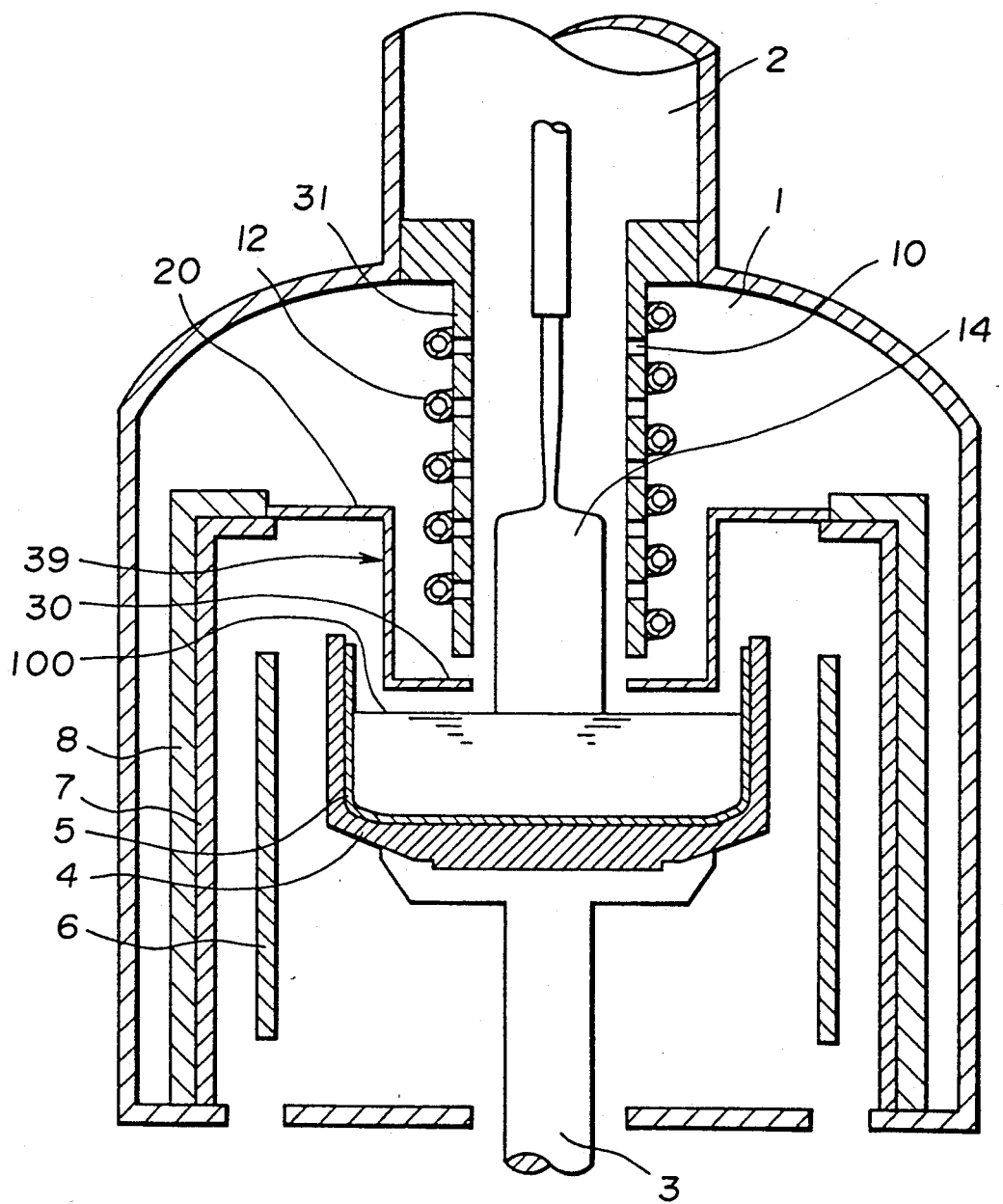
FIG. 11 illustrates a longitudinal section of a single crystal pulling apparatus of the tenth embodiment of the present invention.
Figure 14:
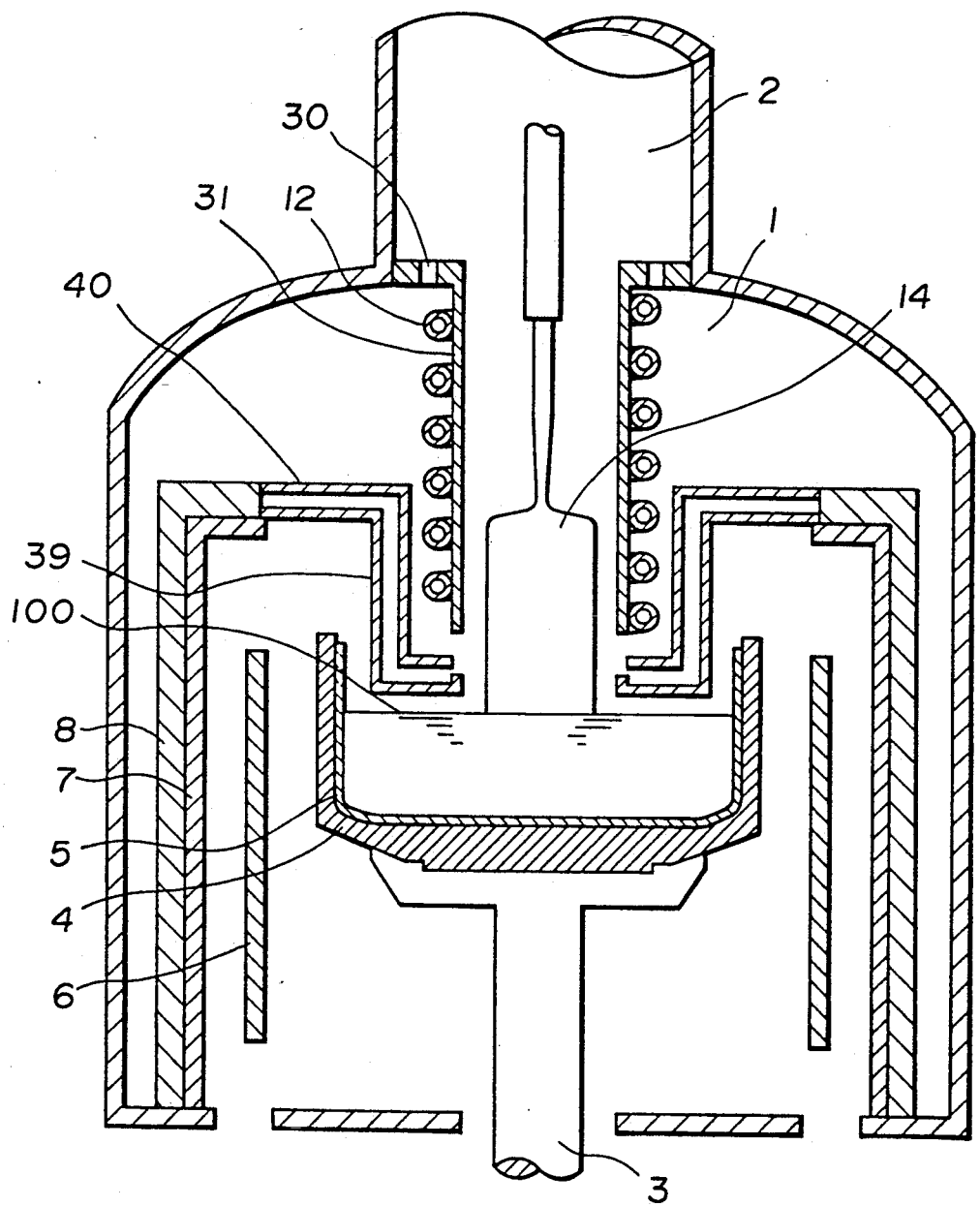
FIG. 14 illustrates a longitudinal section of a single crystal pulling apparatus of thirteenth embodiment of the present invention.

As seen in FIG. 14, the single crystal pulling apparatus of the embodiment 13 comprises in addition to the features of the embodiment 10 (see FIG. 11), a third metal screen 50 of Mo, W or Ta of high coefficient of heat radiation positioned between a first screen 39 and a second screen 31 so as to reflect heat radiated from the first screen 39 and thereby promote to cool a grown single crystal 14.

Since the third screen 50 is positioned between the first and second screens 39 and 31 out of contact with the both screens 39 and 31 and is made of Mo, W or Ta of high coefficient of heat radiation, it reflects heat radiated from the first screen 39 to thermally insulate the second screen 31 from the first screen 39.

EMBODIMENT 14

A single crystal pulling apparatus of the embodiment 14 will be described hereinafter. In the description of the embodiment 14, the same components as those of the embodiments 9–13 have the same labels and descriptions thereof will not be repeated.

Figure 15:
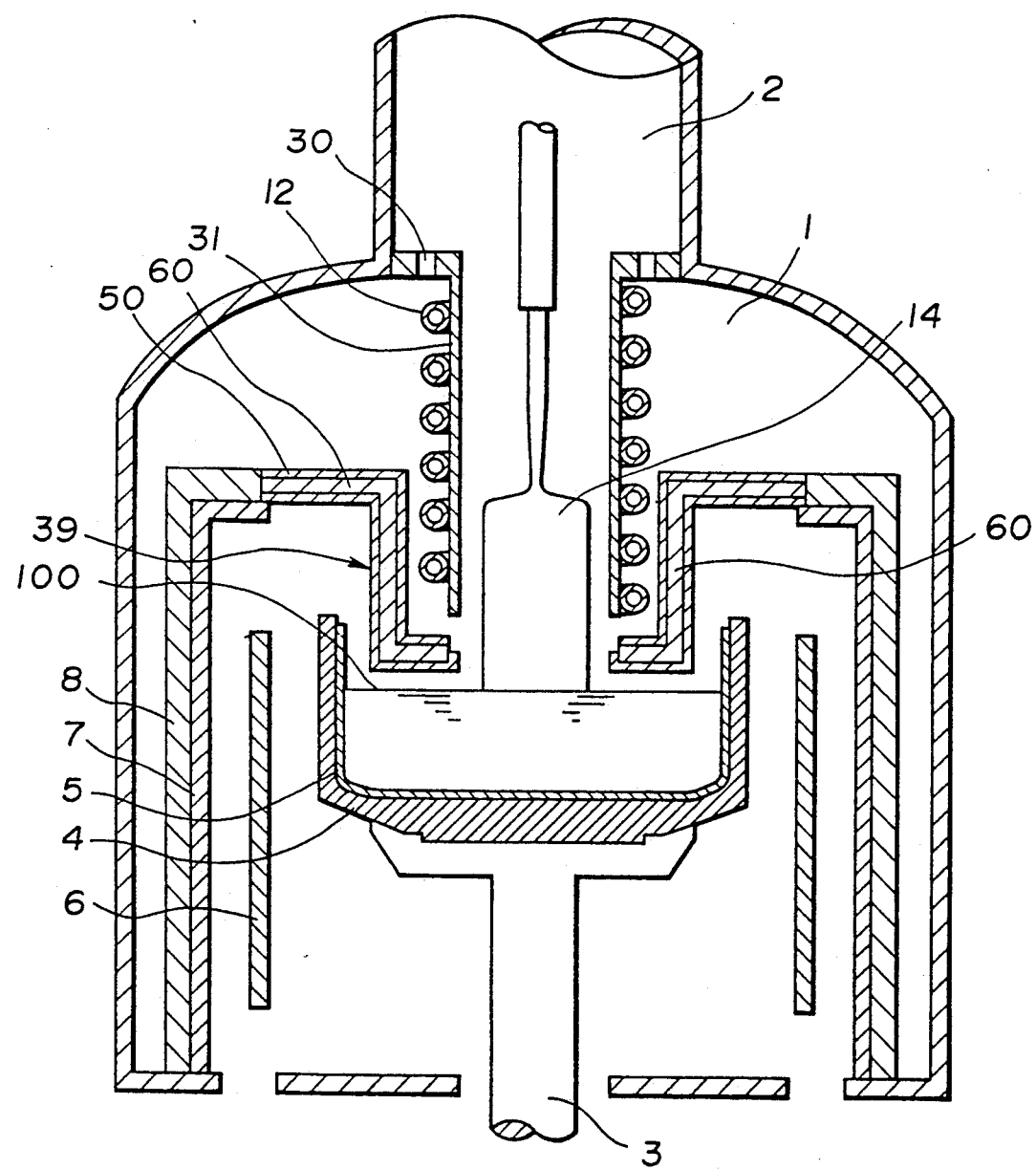
FIG. 15 illustrates a longitudinal section of a single crystal pulling apparatus of the fourteenth embodiment of the present invention.

As seen in FIG. 15, the single crystal pulling apparatus of the embodiment 14 is different from that of the embodiment 13 (see FIG. 14) in that an insulation layer 60 is made with an insulator filling the spacing between the first screen 39 and the third screen 50 in order to promote to cool a grown single crystal 14.

Since the third screen 50 is positioned between the first and second screens 39 and 31 out of contact with the both screens 39 and 31 and is made of Mo, W or Ta of high coefficient of heat radiation, it reflects heat radiated from the first screen 39 to efficiently thermally insulate the second screen 31 from the first screen 39.

What is claimed is:

1. A single crystal pulling apparatus, comprising:
   a crucible charged with a raw material;
   heater means for melting said raw material;
   pulling means for immersing a seed crystal in the melted raw material and pulling a resulting single crystal while growing the single crystal;
   first screen means in the shape of a hollow cylinder, said first screen means having a double-layered structure in which one layer facing the crucible is made of a heat absorbent material and another layer is made of a heat insulator material, an upper end of said first screen means being formed with an outwardly extending flange, a lower end of said first screen means being formed with an inwardly extending flange, said first screen means surrounding a single crystal pulling zone such that the inwardly extending flange is positioned in the crucible below an upper end of the crucible and near a surface of the melt in the crucible; and
   second screen means positioned inside and spaced from the first screen means, a vertical section of said second screen means being in parabolic shape, a center portion of said second screen means being open such as to surround the single crystal pulling zone, an upper end of said second screen means being formed with an outwardly extending flange covering the outwardly extending flange of said first screen means.

2. The single crystal pulling apparatus as recited in claim 1, wherein the second screen means is provided with a cooling device.

3. The single crystal pulling apparatus as recited in claim 1, wherein surface of said one layer made of the heat absorbent material is coated with SiC or $Si_3N_4$.

4. The single crystal pulling apparatus as recited in claim 1, wherein said another layer is made of carbon.

5. A single crystal pulling apparatus, comprising:
   a crucible charged with a raw material;
   heater means for melting the raw material charged in the crucible;
   pulling means for immersing a seed crystal in the melted raw material and pulling a resulting single crystal while growing the single crystal;
   first screen means in the shape of a hollow cylinder, the first screen means having a double-layered structure in which one layer facing the crucible is made of a heat absorbent material and another layer is made of an heat insulator material, an upper end of the first screen means being formed with an outwardly extending flange, a lower end of the first screen means being formed with an inwardly extending flange, the first screen means surrounding a single crystal pulling zone such that the inwardly extending flange is positioned near a melt charged zone in the crucible;
   second screen means provided inside the first screen means along an inner side of the first screen means, an upper end of the second screen means being formed with an outwardly extending flange covering the outwardly extending flange of the first screen means.

6. The single crystal pulling apparatus as recited in claim 5, wherein the second screen means is provided with a cooling device.

7. The single crystal pulling apparatus as recited in claim 5, wherein the surface of said one layer of the heat absorbent material is coated with SiC or $Si_3N_4$.

8. The single crystal pulling apparatus as recited in claim 5, wherein said another layer is made of carbon.

9. A single crystal pulling apparatus, comprising:
   a chamber;
   a crucible provided in the chamber and charged with a raw material;
   heater means for melting the raw material charged in the crucible;
   pulling means for immersing a seed crystal in the melted raw material and pulling a resulting single crystal while growing the single crystal;
   first screen means for surrounding a single crystal pulling zone with a diameter reducing in a downward direction and having openings at upper and lower ends, a lower end of the first screen means being positioned in the crucible below an upper end of the crucible and near a surface of the melt in the crucible; and
   second screen means provided inside of the first screen means and in the shape of hollow round or polygonal cylinder, a sidewall thereof being provided with an opening, a lower end of the second screen means extending to near the lower end of the first screen means, an upper end thereof extending a wall of the chamber.

10. The single crystal pulling apparatus as recited in claim 9, wherein the second screen means is provided with a cooling device.

11. The single crystal pulling apparatus as recited in claim 9, wherein the first screen means is of a double-layered structure and comprises one layer facing the crucible made of a heat absorbent material and another layer made of an insulator material.

12. The single crystal pulling apparatus as recited in claim 11, wherein a surface of the one layer is coated with SiC or $Si_3N_4$.

13. The single crystal pulling apparatus as recited in claim 11, wherein the another layer is made of carbon.

14. A single crystal pulling apparatus, comprising:
   heater means for melting said raw material;
   pulling means for immersing a seed crystal in the melted raw material and pulling a resulting single crystal while growing the single crystal;
   first screen means in the shape of a hollow cylinder, an upper end thereof being provided with an outwardly ending flange, a lower end thereof being provided with an inwardly extending flange, the first screen means surrounding a single crystal pulling zone such that the inwardly extending flange is positioned in the crucible below an upper end of the crucible and near a surface of the melt in the crucible; and
   second screen means provided inside of the first screen means and being in the shape of hollow round or polygonal cylinder, a sidewall of the second screen means being provided with an opening, a lower end thereof extending to near the lower end of the first screen means, an upper end thereof extending to a wall of the chamber.

15. The single crystal pulling apparatus as recited in claim 14, wherein the second screen means is provided with a cooling device.

16. The single crystal pulling apparatus as recited in claim 14, wherein the first screen means is of a double-layered structure and comprises one layer facing the crucible made of a heat absorbent material and another layer made of an insulator material.

17. The single crystal pulling apparatus as recited in claim 16, wherein the second screen means is provided with a cooling device.

18. The single crystal pulling apparatus as recited in claim 16, wherein a surface of the one layer is coated with SiC or $Si_3N_4$.

19. The single crystal pulling apparatus as recited in claim 16, wherein said another layer is made of carbon.

20. The single crystal pulling apparatus as recited in claim 14, wherein the first screen means has a third screen positioned on the side of the second screen means and with a spacing from the first screen means by a predetermined distance.

21. The single crystal pulling apparatus as recited in claim 20, wherein the spacing between the first and third screens means is filled with an insulator material.

* * * * *